United States Patent [19]

Nguyen

[11] Patent Number: 5,150,195

[45] Date of Patent: Sep. 22, 1992

[54] RAPID-CURING ADHESIVE FORMULATION FOR SEMICONDUCTOR DEVICES

[75] Inventor: My N. Nguyen, San Diego, Calif.

[73] Assignee: Johnson Matthey Inc., Valley Forge, Pa.

[21] Appl. No.: 602,504

[22] Filed: Oct. 24, 1990

[51] Int. Cl.⁵ ............................................. H01L 23/14
[52] U.S. Cl. ...................................... 357/72; 357/80; 252/512
[58] Field of Search ............... 528/422, 99, 88, 92, 528/119; 560/301; 252/512, 514; 357/72, 80

[56] References Cited

U.S. PATENT DOCUMENTS

| | | | |
|---|---|---|---|
| 4,401,776 | 8/1983 | Munk | 523/443 |
| 4,552,690 | 11/1985 | Ikeguchi et al. | 252/512 |
| 4,604,452 | 8/1986 | Shimp | 528/422 |
| 4,608,434 | 8/1986 | Shimp | |
| 4,709,008 | 11/1987 | Shimp | 528/422 |
| 4,740,584 | 4/1988 | Shimp | 528/422 |
| 4,785,075 | 11/1988 | Shimp | 528/422 |
| 4,839,442 | 6/1989 | Craig. Jr. | 528/422 |
| 4,847,233 | 7/1989 | Shimp | 502/171 |
| 4,861,823 | 8/1989 | Qureshi | 524/606 |
| 4,999,699 | 3/1991 | Christie et al. | 528/422 |
| 5,002,818 | 3/1991 | Licari et al. | 528/422 |

OTHER PUBLICATIONS

D. A. Shimp and W. M. Craig, Jr., entitled New Liquid Dicyanate Monomer for Rapid Impregnation of Reinforcing Fibers, 34th International Sampe Symposium, 1989.
Hi-Tek Polymers, entitled AroCy Cyanate Ester Safety and Handling Bulletin, AroCy Safety and Handling, May 1989.

Primary Examiner—Rolf Hille
Assistant Examiner—S. V. Clark
Attorney, Agent, or Firm—Christie, Parker & Hale

[57] ABSTRACT

A rapid curing adhesive formulation that contains 10–40 wt. % of a cyanate ester vehicle having a cyanate ester, alkylphenol and a metal curing catalyst and 60–90 wt. % of thermally and/or electrically conductive filler. The adhesive formulation has a maximum curing time of 5 minutes, preferably 2 minutes, at 200° C. and is adapted for use in high speed processes for production of bonded semiconductor assemblies.

17 Claims, 5 Drawing Sheets

RAPID-CURING ADHESIVE FORMULATION FOR SEMICONDUCTOR DEVICES

BACKGROUND OF THE INVENTION

The present invention relates to an adhesive formulation which can be rapidly cured and which is suitable for bonding semiconductor devices to a substrate. More particularly, the invention relates to an adhesive formulation for bonding semiconductor chips, also known as "dies", to a lead frame and, still more particularly, to an adhesive formulation which may be dispensed in small amounts at high speed and with sufficient volume control to enable the adhesive to be deposited on a substrate in a continuous process for the production of bonded semiconductor assemblies.

Organic adhesives have been used to bond IC chips to metal lead frames in plastic packages. Die attach adhesives which have been employed for this purpose include either epoxy or polyimide material filled with precious metal. However, epoxy and polyimide suffer from various shortcomings.

Epoxy adhesives generally have low glass transition temperature, i.e., less than 150° C. for liquid epoxy, and have a high degree of ionic contaminants. Although epoxy can be rapidly cured, the low glass transition temperature and ionic contaminants adversely effect the reliability of the material. Polyimide adhesives generally contain solvents and require a lengthy curing time, often exceeding two hours.

As dies become increasingly larger, the need for a suitable, rapidly-curing adhesive has increased. To accommodate the growing need for bonding dies to substrates in a continuous manner at high production speeds, it is desirable that the adhesives have a glass transition temperature that exceeds 200° C., contains little or no solvents or diluents, has a very low level of ionic contaminants, provides good adhesion at room temperature and at temperatures greater than 150° C. and, importantly, is able to be cured rapidly, i.e., in less than 5 minutes at 200° C., preferably less than 2 minutes at 200° C. The ability of an adhesive to be rapidly cured is especially important since the curing rate affects the usefulness of the adhesive in continuous processes for production of bonded semiconductor assemblies.

In accordance with the present invention, a rapidly curing adhesive formulation suitable for bonding semiconductor devices to a substrate may be formulated using a cyanate ester such as "AROCY L10" available from Hi-Tek Polymers, Inc. of Louisville, Ky. This cyanate ester is a liquid dicyanate monomer such as described in Shimp U.S. Pat. No. 4,785,075, Craig, Jr. U.S. Pat. No. 4,839,442 and in an article entitled *New Liquid Dicyanate Monomer for Rapid Impregnation of Reinforced Fibers*, by Shimp and Craig, Jr., presented at the 34th International Sampe Symposium in Reno, May 8 to 11, 1989, the disclosures of which are all, individually and collectively, specifically incorporated herein by reference.

The cyanate esters are resins of a family of aryl dicyanate monomers and their pre-polymer which contain a reactive cyanate functional group. When heated the cyanate functionality undergoes exothermic cyclotrimerization reaction to form triazine ring connection units which result in gelation and formulation of thermo set polycyanurate plastics.

It is known that metal catalysts such as napthenates, acetylacetonates or chelates of zinc, copper, and cobalt dissolved in alkylphenols, such as nonylphenol, will affect the curing time of the cyanate ester in connection with fiber impregnation, as described in the aforementioned Shimp and Craig, Jr. article. However, the practical use of cyanate esters in formulating adhesive films for bonding semiconductor devices to substrates, especially in continuous processes, has not heretofore been suggested or described. Furthermore, it is not at all obvious that cyanate ester resins should be used in the formulation of die attach adhesives requiring rapid curing. When heated, cyanate esters undergo exothermic cyclotrimerization reactions liberating heat by this reaction of 24 kcal per gram-equivalent, which is enough heat to raise the batch temperature as much as 390° C. under adiabatic conditions. Adiabatic reactions are created when small quantities, such as 200 grams, are overheated, or over-catalyzed so as to release all of the reaction energy in a short time, i.e., a few minutes or less. The excess temperature may cause a dangerous runaway reaction and thermal decomposition of the material. As a result, the cure schedules that are recommended are usually very lengthy, up to several hours with carefully controlled curing temperatures. These conditions are described in the aforementioned Shimp and Craig, Jr. article and would suggest that cyanate esters are unsuitable for the practical and general use to which the present invention is applicable.

The following are typical cure schedules recommended by Hi-Tek Polymers, Inc. for the cyanate ester resin:

Minutes to gel at 104° C.—15 minutes
Hours at 177° C. to cure—one hour
Hours at 210° C. to cure—one hour
Hours at 250° C. to cure—two hours As can be seen, therefore, the curing schedule heretofore recommended for cyanate ester is very lengthy and unsuited for semiconductor bonding processes, especially high speed continuous production processes.

Notwithstanding the foregoing, it has been discovered that the use of cyanate ester resin in a rapidly curing die attach adhesive formulation is feasible under the following conditions: 1) including a filler with high thermal conductivity in the adhesive formulation; (2) applying the adhesive formulation as a thin bonding layer, e.g., 5 mil or less, preferably 1 or 2 mil or less; (3) dispensing small amounts of adhesive, e.g., less than 2 mg at a time, during continuous processes for production of bonded semiconductor assemblies; and (4) applying the adhesive for bonding to surfaces made of material having a high thermal conductivity, e.g., ceramics, lead frames, copper, alloy 42, etc.

When the foregoing conditions are present, the cyanate ester-containing adhesive can be cured rapidly without detrimental effects since all the heat of reaction can be removed by the high thermal conductivities of the adhesive loaded with thermally and/or electrically conductive filler and the surfaces to which the dies are to be bonded which may also have a high thermal conductivity, and especially with the use of relatively thin adhesive films that result in a thin bond line thickness.

SUMMARY OF THE INVENTION

The rapidly curing adhesive formulation of the invention includes a cyanate ester vehicle which comprises cyanate ester, alkylphenol and a metal curing catalyst dissolved in the akylphenol. Advantageously, the cyanate ester vehicle comprises liquid cyanate ester having a viscosity of about 1 to 5 poise at 25° C., about 2 to 6 parts per hundred (pph) alkylphenol and about 50 to 500 parts per million (ppm) of a metal catalyst.

A rapidly curing die attach adhesive formulation in accordance with the invention suitable for attaching a semiconductor device to a substrate in high speed production processes comprises 10–40 wt.% cyanate ester vehicle and 60 to 90 wt.% of thermally and/or electrically conductive filler.

These proportions of cyanate ester vehicle and filler in the adhesive formulation are important in order to achieve satisfactory properties. If less than 60% filler is used, the thermal and/or electrical conductivity and viscosity will be too low. The adhesive strength of the adhesive formulation is adversely affected if the filler comprises less than 60% or more than 90% and, when the filler exceeds 90%, the viscosity is too high for dispensing the formulation in high speed continuous processes for the production of bonded semiconductor assemblies.

As described above, the cyanate ester vehicle comprises a liquid cyanate ester having a viscosity of about 1 to 5 poise at 25° C., about 2 to 6 pph alkylphenol and about 50 to 500 ppm of a metal catalyst. The filler comprises particulate material of less than 70 microns, preferably less than 20 micron size, and the resulting adhesive formulation has a maximum curing rate of about 5 minutes at 200° C., preferably about 2 minutes at 200° C.

Also in accordance with the invention there is provided a bonded semiconductor assembly comprising a semiconductor bonded to a substrate by a cured adhesive formulation, as described, and an improvement in the method of bonding semiconductor devices in semiconductor assemblies at high production speeds.

DESCRIPTION OF PREFERRED EMBODIMENTS

In bonding semiconductor devices to a substrate, it is important to have a minimum amount of shrinkage. If the thermal conductivity of the material being bonded is very high, heat may be removed rapidly. Therefore, an adhesive with a rapid curing time, i.e., 5 minutes or less at 200° C., preferably 2 minutes or less at 200° C., may be used provided that the adhesive formulation combines appropriate rheological and other dispensing properties suitable for use in the high speed production of semiconductor assemblies.

For suitable dispensing characteristics at high speed, the adhesive formulation must also have rheological properties which may be altered in accordance with the type of dispensing equipment. By adjusting the range of filler material contained in the new adhesive formulation, it is possible to adjust the rheology. However, the amount of filler must be selected to meet the thermal and electrical conductivity requirements of the product and to enable the adhesive formulation to be rapidly cured. It has been determined that 60 to 90% wt.% filler will achieve the desired combination of properties.

Both powder and flake forms of filler materials may be used in the adhesive formulation. Flake is presently preferred over powder for adhesive formulations suitable for bonding semiconductor devices because it tends to impart less stress on the semiconductor device and gives better thermal and electrical conductivities. The effect of stress on the semiconductor device may be seen by plotting the radius of curvature of a die after curing. A measure of the stress applied to the semiconductor device during curing, i.e., bonding, is reflected in the radius of curvature of the die after die bonding and curing. The greater the radius of curvature, the flatter the die surface and thus the less stress being placed on the semiconductor chip during curing.

The following examples illustrate adhesive formulations in accordance with the invention having suitably rapid curing characteristics and suitable rheological properties for dispensing in small amounts in high speed continuous processes for producing bonded semiconductor assemblies.

The following compositions were prepared with silver, nickel and silicon filler materials as indicated and are expressed in wt.%.

EXAMPLE 1

Silver filled adhesive:

| | |
|---|---|
| Cyanate Ester "Arocy L10" | 24.485 |
| Ag flake | 75.000 |
| Nonylphenol | 0.490 |
| Cobaltic Acetylacetonate | 0.025 |

EXAMPLE 2

Nickel filled adhesive:

| | |
|---|---|
| Cyanate Ester "Arocy L10" | 32.258 |
| Nickel flake | 64.000 |
| Nonylphenol | 0.705 |
| Cobaltic Acetylacetonate | 0.037 |

EXAMPLE 3

Nickel filled adhesive:

| | |
|---|---|
| Cyanate Ester "Arocy L10" | 14.691 |
| Nickel powder | 85.000 |
| Nonylphenol | 0.294 |
| Cobaltic Acetylacetonate | 0.015 |

EXAMPLE 4

Silicon filled adhesive:

| | |
|---|---|
| Cyanate Ester "Arocy L10" | 35.258 |
| Silicon powder | 64.000 |
| Nonylphenol | 0.705 |
| Cobaltic Acetylacetonate | 0.037 |

Figure 1:
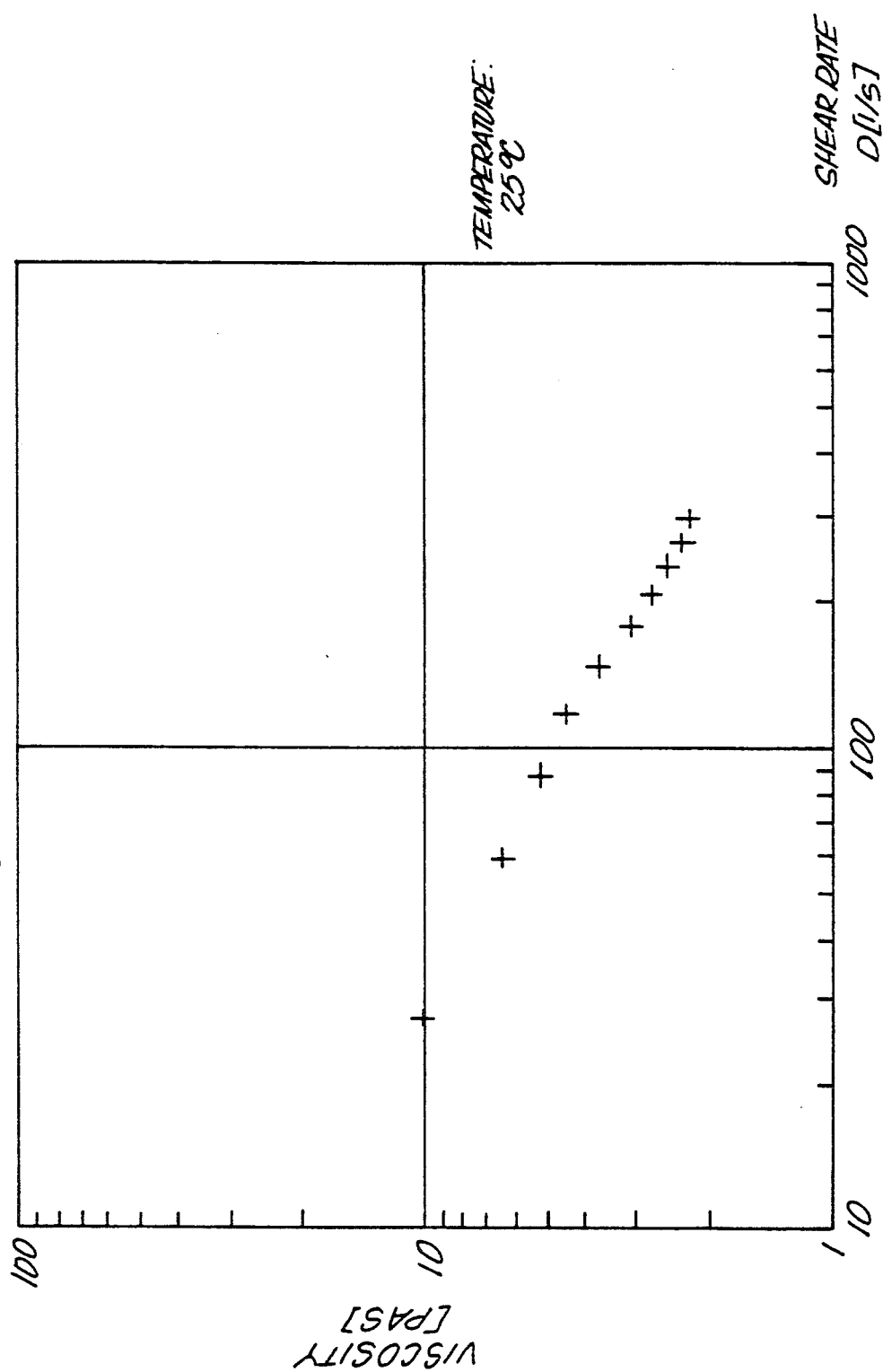
FIG. 1 is a graph showing the relationship between viscosity and shear rate of a silver flake-containing adhesive formulation.

The foregoing compositions were tested for rheological properties, since such properties are important in the automatic dispensing of the adhesive during high speed continuous production runs. FIG. 1 shows the viscosity of Example 1, the silver flake formulation, and expresses the viscosity as pascal seconds (1 pascal second = 10 poise) against the shear rate. The shear rate is a measure of how fast the material is sheared. As can be seen, the viscosity tends to decrease with increasing shear rate.

Figure 2:
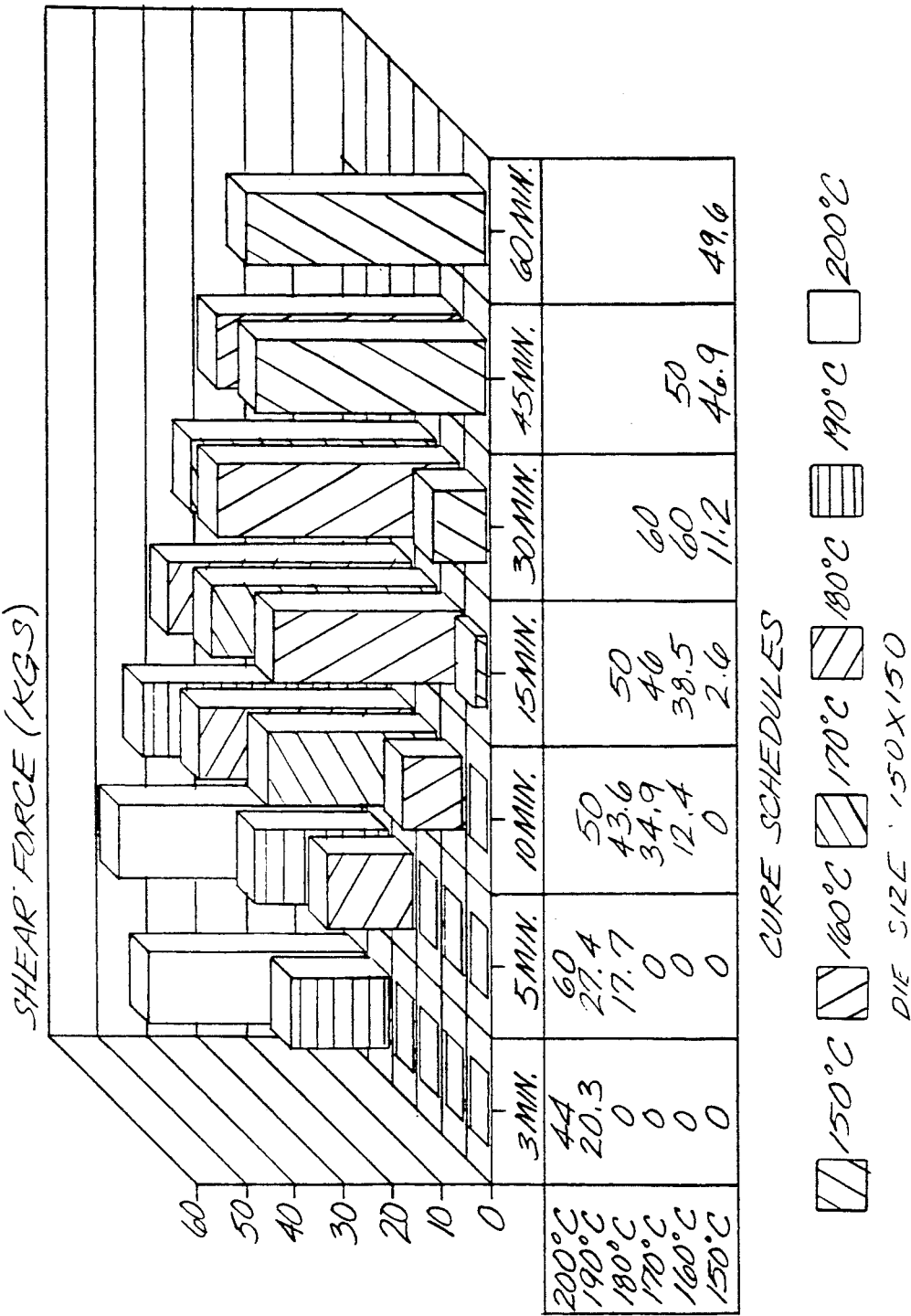
FIG. 2 is a graph showing the shear force for nickel powder-filled adhesive formulation at various curing temperatures.

The relationship of shear force and curing temperature of nickel powder filled adhesive formulations is illustrated in FIG. 2 in which the shear force is compared against curing schedules. As can be seen, effective bonding strength is achievable at the rapid curing conditions of 5 minutes or less at 200° C.

Figure 3:
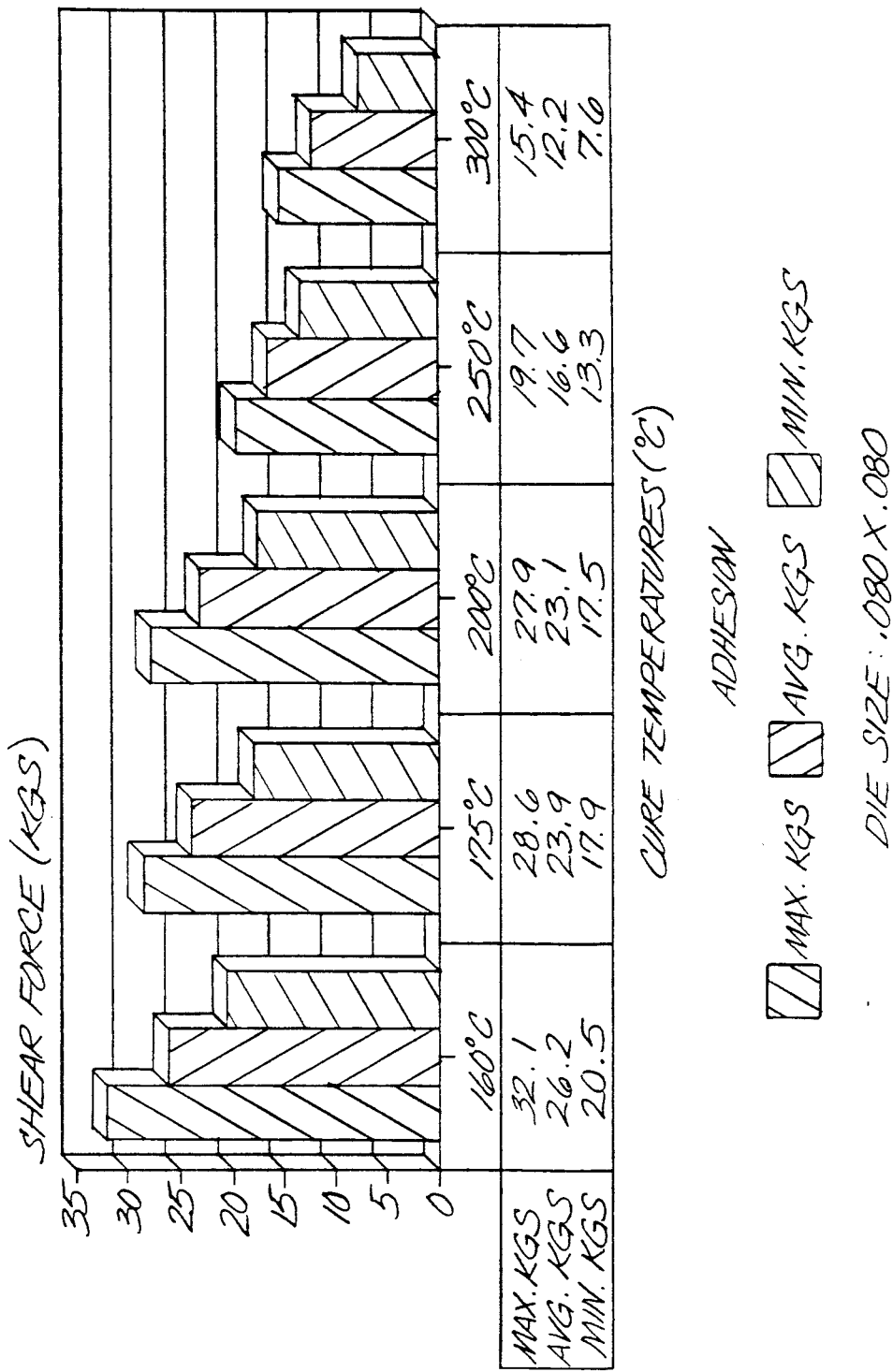
FIGS. 3, 4 and 5 are graphs showing the shear force of silver, nickel and silicon filled adhesive formulations, respectively, at different curing temperatures.
Figure 4:
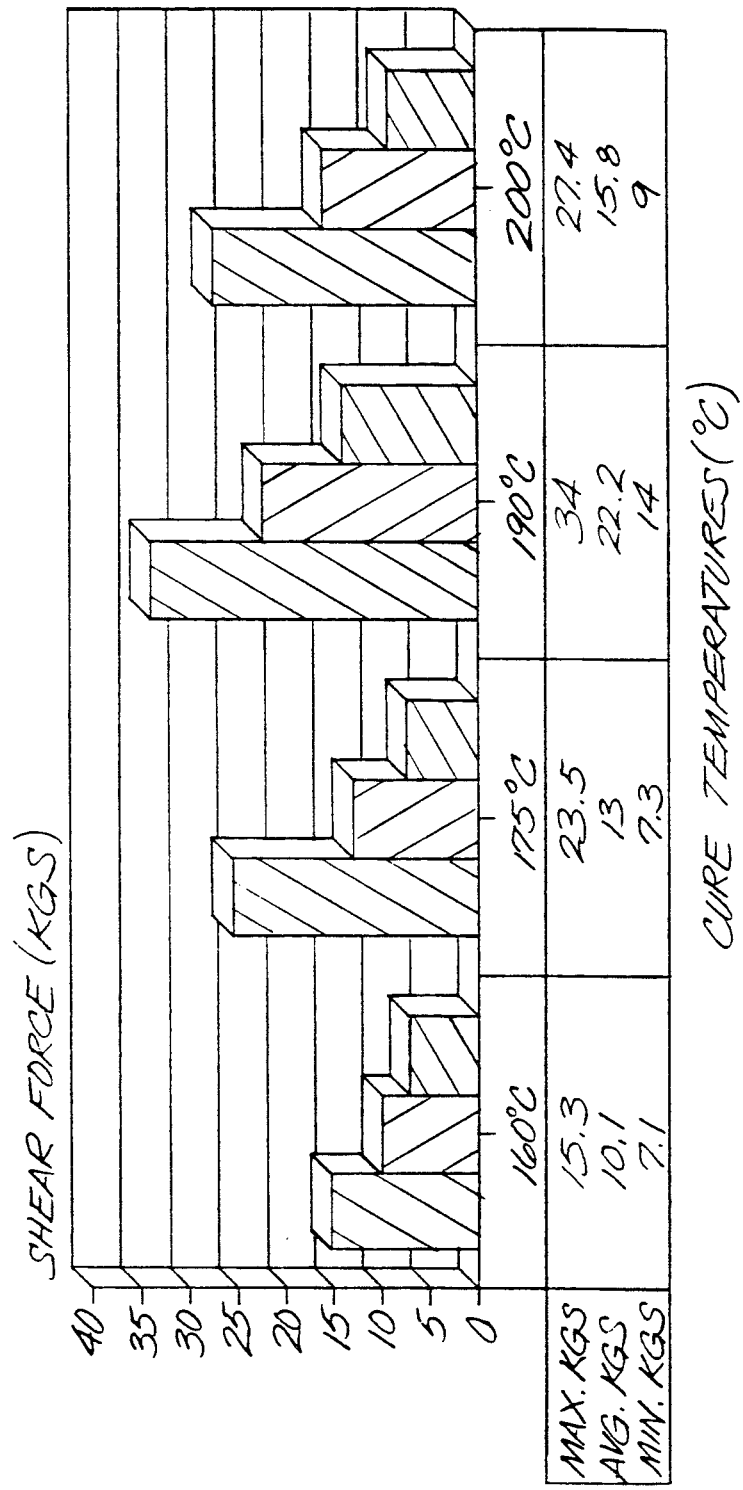
Figure 5:
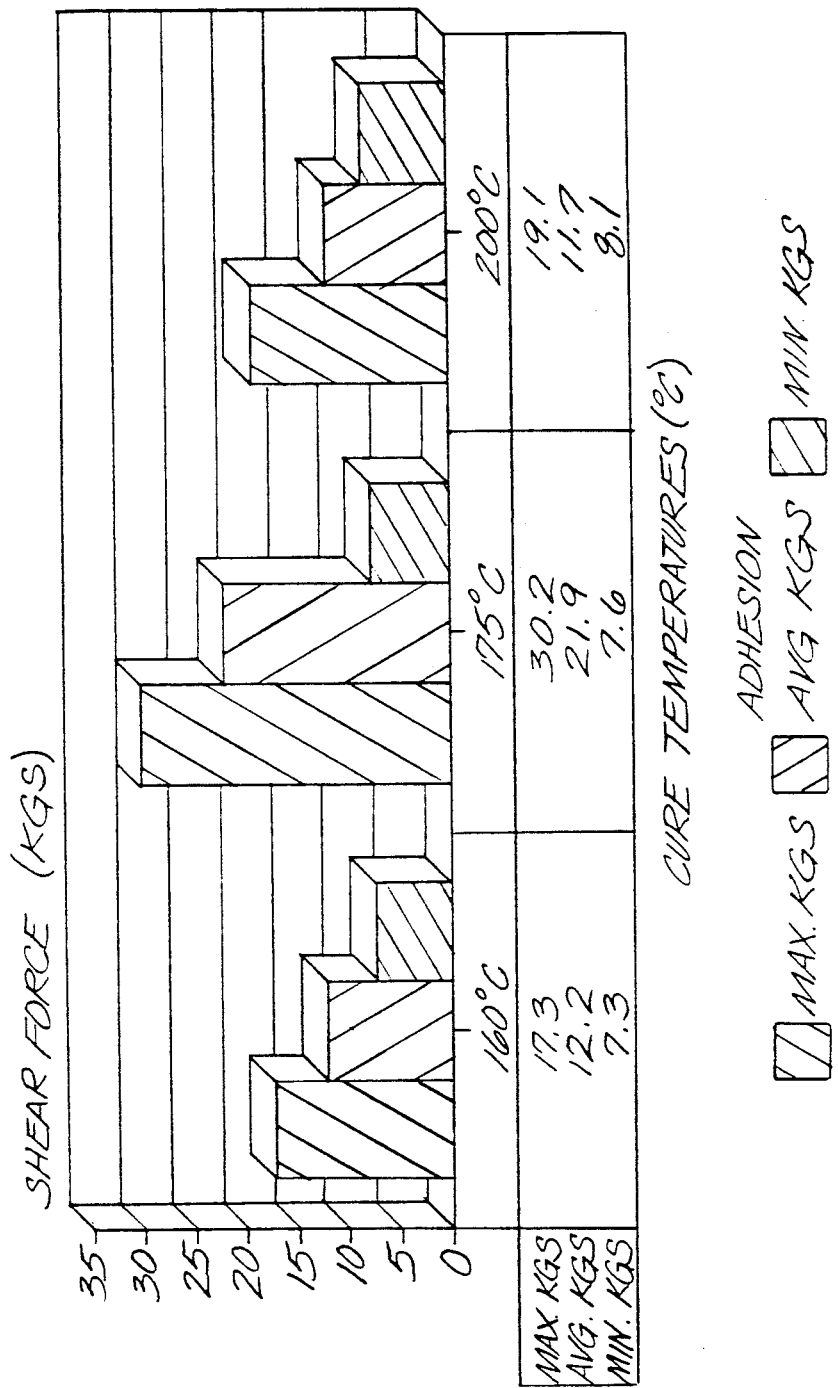

FIGS. 3, 4 and 5 show the shear force of silver, nickel and silicon-filled adhesive formulations, respectively, at different curing temperatures. The data summarized in these graphs simulates conditions encountered in a typical bonding process for bonding semiconductor devices which involves curing at 80 seconds followed by exposure at 300° C. for 15 seconds during which time wires are bonded to the semiconductor devices.

Presently preferred processing conditions for silver and nickel-filled adhesive formulations are as follows:

| Temperature (°C.) | Curing Time (Min.) |
|---|---|
| Silver-filled: | |
| 160 | 2.0 |
| 185 | 0.7 |
| 200 | 0.4 |
| Nickel-filled: | |
| 150 | 60.0 (unsatisfactory) |
| 180 | 7.0 (unsatisfactory) |
| 200 | 2.0 |

The silver and nickel can be used either as flake or powder. The thickness of flake is usually under two microns with a maximum dimension of 15 to 20 microns, whereas powder diameter may be 8 to 9 microns. Silver flake generally has a surface area of about 0.2 to 1.5 m$^2$/g and a tap density of about 2.5 to 4 g/cc. Preferred range of silver filler is about 70 to 90 wt.% of total weight of the adhesive formulation.

A typical preferred composition is:

| Temperature (°C.) | Curing Time (Min.) |
|---|---|
| Silver-filled: | |
| 160 | 2.0 |
| 185 | 0.7 |
| 200 | 0.4 |
| Nickel-filled: | |
| 150 | 60.0 (unsatisfactory) |
| 180 | 7.0 (unsatisfactory) |
| 200 | 2.0 |

Other useful catalysts are zinc napthenate, copper napthenate, copper acetylacetonate, cobaltous and cobaltic acetylacetonate. Typical adhesion obtained on a 300 mil$^2$ die averages 125 lbs. after curing at 250° C. for 50 seconds.

In other tests, various metal catalysts were evaluated for practical suitability in the adhesive formulation. Since pot life is an important practical consideration, zinc acetylacetonate, cobaltic acetylacetonate and cobaltous acetylacetonate were subjected to pot life tests at 20° C. The pot lives for these compositions were found to be 8, 12 and 20 hours, respectively. Pot life is determined by the onset of an increase in viscosity of an adhesive. It has been determined that by virtue of its satisfactory pot life and suitable rapid curing capability, cobaltic acetylacetonate is preferred for most applications because it has adequate pot life and yet produces a rapid curing cycle.

Nickel and silicon fillers have proven to be satisfactory low cost substitutes for silver. The amount of filler which is used in the adhesive formulation may be varied in accordance with the thermal and electrical conductivities and curing time desired for particular applications. These materials produce a low die stress during die attach application.

Although powder and flake forms of fillers may be used, the flake form may be preferred for some applications because flake-containing adhesive formulations tends to shrink in only one direction. They also have higher electrical and thermal conductivity. In contrast, powder forms tend to shrink in three dimensions and the shrinkage can affect the amount of stress on the chip and on the substrate to which the chip is bonded because the chip and substrate generally have different thermal expansion characteristics. Bending of the semiconductor chip may result if the difference in thermal expansion coefficients is too severe. In any case, minimum amount of shrinkage is desirable. Where the thermal conductivity of the substrate to which the chip may be bonded is high, heat may be rapidly removed, thereby also assisting in reducing the thermal stress on the chip. The rapid removal of the heat during curing is highly desirable to enable rapid curing of the adhesive, i.e., short adhesive curing time will reduce the stress placed on the chip and the possible deformation of the chip during curing.

In addition to adhesive formulations using silver, nickel or silicon, formulations which are thermally conductive may comprise:
alumina powder, 60–90 wt.%
cyanate ester vehicle, 10–40 wt.% and
aluminum nitride powder, 60–90 wt.%
cyanate ester vehicle, 10–40 wt.%

An adhesive formulation is advantageously made by first dissolving the metal catalyst in powder form in the alkylphenol, e.g., nonylphenol, heating at above 60° C. with stirring, e.g., magnetic stirring, to produce a solution of the catalyst in the alkylphenol. The resulting solution is then mixed with liquid cyanate ester to produce a solution to which the filler is added. The mixture of filler and cyanate ester vehicle is mixed, for example, in a planetary mixer, desirably under vacuum at room temperature (20° C.) for about ½ to 1 hour to form a homogeneous paste. The paste is stored at low temperatures, e.g., −10° C., until needed to prevent curing until ready for use. When the adhesive formulation is to be dispensed onto a lead frame, for example, for bonding the semiconductor device, it is removed from the low temperature storage and applied as a suitably thin film to the substrate for bonding of the chip. The semiconductor assembly is then cured by heating at controlled temperature, usually at 180° to 200° C.

Bonded semiconductor assemblies are commonly made by a batch process in which an adhesive is placed at selected portions of a substrate, such as a lead frame, where dies will be located. The semiconductor dies are then placed on the adhesive portion after which pressure is applied to the die to assure that the adhesive is in full contact on the surface between the die and the substrate to which it is to be bonded. Thereafter, a batch of semiconductor assemblies to be bonded is placed in a curing oven for curing, which may require thirty minutes to three hours at 150° C. to 250° C. depending upon the adhesive used. Following curing of the adhesive to effect bonding of the semiconductor to the substrate, the assembly is removed from the curing oven and wires are attached to the semiconductors for electrical contacts. The bonded assembly is then encapsulated, usually with some form of epoxy, to protect it during handling and use.

Since the curing time for adhesive formulations which have been used is very lengthy, the bonding of semiconductive assemblies has not been amenable to continuous processing. Because the adhesive formulation of the present invention is able to be cured rapidly, e.g., less than five minutes, and preferably less than one to two minutes, at 200° C., a continuous process for producing bonded semiconductor assemblies becomes feasible. In such a continuous process, the adhesive formulation is dispensed in predetermined quantities intermittently continuously on a substrate, e.g., lead frame or ceramic or metal substrate, after which the semiconductor dies are placed on the adhesive in a continuous fashion with pressure applied to assure spreading of the adhesive under the entire die surface. Thereafter, the substrate with the accompanying semiconductor devices is continuously passed through a heating zone to cure the adhesive, which may be accomplished with the adhesive formulation described herein at a maximum curing rate of less than five minutes, and preferably less than one or two minutes, at 200° C. The bonded assembly can then be continuously passed through a wire bonding zone during where wires are connected to the semiconductor dies.

It is apparent from the foregoing that various changes and modifications may be made without departing from the spirit of the invention.

Accordingly, the scope of the invention should be limited only by the appended claims wherein what is claimed is:

1. An adhesive formulation suitable for attaching a semiconductor device to a substrate comprising 10 to 40 wt.% cyanate ester vehicle and 60 to 90 wt.% of thermally and/or electrically conductive filler,
    said cyanate ester vehicle comprising liquid cyanate ester having a viscosity of about 1 to 5 poise at 25° C., about 2 to 6 pph alkylphenol and about 50 to 500 ppm of metal catalyst,
    said filler comprising particulate material of less than 70 microns; and
    said adhesive having the capability of being cured in about 5 minutes at 200° C.

2. An adhesive formulation according to claim 1 wherein said alkylphenol comprises nonylphenol.

3. An adhesive formulation according to claim 1 wherein said metal curing catalyst comprises a metal carboxylate or acetylacetonate.

4. An adhesive formulation according to claim 3 wherein said catalyst comprises at least one carboxylate or acetylacetonate of a metal from the group consisting is dissolved in said alkylphenol.

5. An adhesive formulation according to claim 4 wherein said catalyst comprises one of cobaltous and cobaltic acetylacetonate.

6. An adhesive formulation according to claim 5 wherein said catalyst comprises cobaltic acetylacetonate.

7. An adhesive formulation according to claim 1 wherein said filler comprises at least one material from the group consisting of silver, nickel, silicon, alumina and aluminum nitride.

8. An adhesive formulation according to claim 1 wherein said filler has a maximum particle size of 20 microns.

9. An adhesive formulation according to claim 1 wherein said adhesive comprises a dispensable material having a viscosity of about 100 to 1000 poise at 25° C.

10. An adhesive formulation according to claim 1 wherein said adhesive is capable of being cured in about 2 minutes at 100° C.

11. An adhesive formulation according to claim 1 wherein said filler comprises a material from the group consisting of silver nickel and silicon, said catalyst comprises a compound of a metal from the group consisting of zinc and cobalt and said curing time capability is less than 2.0 minutes at 200° C.

12. An adhesive formulation according to claim 1 wherein said filler comprises silver flake and said curing time capability is less than 1.5 minutes at 200° C.

13. An adhesive formulation according to claim 1 wherein said filler comprises nickel having a maximum particle size of about 20 microns.

14. A bonded semiconductor assembly comprising a semiconductor bonded to a substrate with an adhesive formulation comprising 10 to 40 wt.% cyanate ester vehicle and 60 to 90 wt.% of thermally and/or electrically conductive filler,
    said cyanate ester vehicle comprising liquid cyanate ester having a viscosity of about 1 to 5 poise at 25° C., about 2 to 6 pph alkylphenol and about 50 to 500 ppm of metal catalyst,
    said filler comprising particulate material of less than 70 microns; and
    said adhesive having the capability of being cured in about 5 minutes at 200° C.

15. A bonded semiconductor assembly according to claim 14 wherein said alkylphenol comprises nonylphenol, said metal curing catalyst comprises a metal carboxylate or acetylacetonate, and said filler comprises at least one material from the group consisting of silver, nickel, silicon, alumina and aluminum nitride.

16. A bonded semiconductor assembly according to a claim 14 wherein said adhesive formulation has a viscosity of about 100 to 1000 poise at 25° C. and a maximum curing time capability of 2.0 minutes, said filler has a maximum particle size of 20 microns and comprises one of the group consisting of silicon, silver, and nickel, and the metal curing catalyst comprises one of the zinc, cobaltic and cobaltous acetylacetonate.

17. An adhesive formulation suitable for attaching a semiconductor device to a substrate comprising 10 to 40 wt.% cyanate ester vehicle and 60 to 90 wt.% of thermally and/or electrically conductive filler, said adhesive formulation having a viscosity of about 100 to 1000 poise at 25° C.,
    said cyanate ester vehicle comprising liquid cyanate ester having a viscosity of about 1 to 5 poise at 25° C., about 2 to 6 pph alkylphenol and about 50 to 500 ppm of metal catalyst,
    said filler comprising particulate material of less than 70 microns; and
    said adhesive having the capability of being cured in about 5 minutes at 200° C.

* * * * *

UNITED STATES PATENT AND TRADEMARK OFFICE
CERTIFICATE OF CORRECTION

PATENT NO. : 5,150,195

DATED : September 22, 1992

INVENTOR(S) : My N. Nguyen

It is certified that error appears in the above-indentified patent and that said Letters Patent is hereby corrected as shown below:

Column 1, line 11, before ""dies"" insert -- as --.

Column 1, line 27, change "effect" to -- affect --.

Column 4, line 1, after "90" delete "%".

Column 5, lines 42-52, delete the table and insert therefor:

```
-- Cyanate ester vehicle    - 100
      nonylphenyl           -   2
      Zn acetylacetonate    -   0.06
   Silver-filled paste:
      silver flake          - 70-90 wt. %
      cyanate ester vehicle - 10-30 wt. % --.
```

UNITED STATES PATENT AND TRADEMARK OFFICE
CERTIFICATE OF CORRECTION

PATENT NO. : 5,150,195
DATED : September 22, 1992
INVENTOR(S) : My N. Nguyen

It is certified that error appears in the above-indentified patent and that said Letters Patent is hereby corrected as shown below:

Column 7, line 57, before "is dissolved" insert
    -- of zinc, copper, manganese and cobalt and
    said catalyst --.

Column 8, line 43, after "according to" delete "a".

Signed and Sealed this

Fourth Day of October, 1994

Attest:

BRUCE LEHMAN

Attesting Officer

Commissioner of Patents and Trademarks